US007910943B2

(12) United States Patent
Kim et al.

(10) Patent No.: US 7,910,943 B2
(45) Date of Patent: Mar. 22, 2011

(54) LIGHT EMITTING DIODE FIXTURE AND HEAT SINK

(75) Inventors: Daniel Kim, Lake Mary, FL (US); Steve Faber, Orlando, FL (US); Michael Bauer, Orlando, FL (US)

(73) Assignee: Nexxus Lighting, Inc., Charlotte, NC (US)

( * ) Notice: Subject to any disclaimer, the term of this patent is extended or adjusted under 35 U.S.C. 154(b) by 314 days.

(21) Appl. No.: 11/265,692

(22) Filed: Nov. 1, 2005

(65) Prior Publication Data

US 2007/0096134 A1 May 3, 2007

(51) Int. Cl.
*H01L 33/00* (2010.01)

(52) U.S. Cl. ................ 257/99; 257/81; 257/88; 257/89; 257/290; 257/291; 257/706

(58) Field of Classification Search .................... 257/79, 257/98, 99, 291, 290, 706, 276.625, 675, 257/707, 712–722, 796, E33.075, E31.131, 257/E23.051, E23.08–E23.113, 81, 82, 88, 257/89, 91, 100, 116, 117, 432–437, 749, 257/E33.056–E33.059, E25.032; 438/122, FOR. 413
See application file for complete search history.

(56) References Cited

U.S. PATENT DOCUMENTS

| | | | | |
|---|---|---|---|---|
| 6,657,382 | B2 * | 12/2003 | Nagai et al. | 313/512 |
| 2004/0264195 | A1 * | 12/2004 | Chang et al. | 362/294 |
| 2005/0094234 | A1 * | 5/2005 | Miyatake et al. | 359/205 |
| 2006/0067077 | A1 * | 3/2006 | Kumthampinij et al. | 362/294 |
| 2006/0202210 | A1 * | 9/2006 | Mok et al. | 257/79 |
| 2007/0041195 | A1 * | 2/2007 | Chen | 362/294 |
| 2008/0007953 | A1 * | 1/2008 | Keller et al. | 362/294 |
| 2008/0023721 | A1 * | 1/2008 | Lee et al. | 257/99 |

* cited by examiner

*Primary Examiner* — Jasmine J Clark
(74) *Attorney, Agent, or Firm* — McGuire Woods LLP

(57) ABSTRACT

A housing for a plurality of light emitting diodes includes a housing providing a heat sink, where the heat sink includes a plurality of protrusions. A control board can be removably coupled to the heat sink and the control board can provide an aperture to receive a lens housing and an aperture to receive a coupling member to secure the control board to the heat sink. Further, a plurality of light emitting diode light engines can be mounted to the control board where the individual heat sink protrusions of the plurality of heat sink protrusions align with individual light engines of the plurality of light engines.

26 Claims, 7 Drawing Sheets

LIGHT EMITTING DIODE FIXTURE AND HEAT SINK

CROSS-REFERENCE TO RELATED APPLICATIONS

Not Applicable.

FIELD OF THE INVENTION

This invention is directed generally to light emitting diode fixtures, and more particularly, to heat sinks providing for compact light emitting diode fixtures.

BACKGROUND OF THE INVENTION

Generating visible light with traditional light sources, such as incandescent or fluorescent light sources, is inefficient because thermal energy is also produced as a by product of the process. The wasted thermal energy is generally directed away from the light source in the direction of the radiant beam of light. Fixtures, such as light shades or reflectors, or even the target illuminated by the light source, receive the wasted thermal energy, and consequently, rise in temperature. In some instances, the rise in temperature can reduce the useful life of a product. Further, the arrangement of traditional light sources are limited to designs that can withstand the waste thermal energy.

In contrast to traditional light sources, solid state lighting, such as a light emitting diode ("LED"), is more efficient at generating visible light than many traditional light sources. Although LEDs do not generally radiate heat in the direction of the beam of light produced, implementation of LEDs for many traditional light source applications has been hindered by the amount of heat build-up within the electronic circuits of the LEDs. Heat build-up reduces LED light output, shortens lifespan and can eventually cause LEDs to fail.

Accordingly, heat sinks have been used to dissipate heat away from LEDs; however, in the past, LEDs have been thermally coupled to heat sinks with adhesive tapes. The use of adhesive tape introduces several problems, such as the labor and time intensive process of providing tape for each individual LED. Further, adhesive tapes are susceptible to being displaced during the assembly process, resulting in less than optimal heat dissipation.

SUMMARY

The present invention concerns a fixture for multiple LEDs and provides a compact light fixture that is significantly smaller in size in comparison to traditional light fixtures while having a greater light producing capability. Further, the fixture is designed to accommodate compact arrangements of LEDs that provide greater luminescence and the ability to control lighting effects in a compact design not previously available with traditional light sources.

In one embodiment, a device for dissipating heat from light emitting diodes can include a heat sink with a plurality of protrusions, a control board coupled to the heat sink and a plurality of light emitting diode light engines mounted to the control board. The individual heat sink protrusions of the plurality of heat sink protrusions can align with individual light engines of the plurality of light engines and the control board can secure the light engines against the heat sink protrusions. Also, the control board can couple to the heat sink with a securing member and the light engines can extend from the control board a uniform distance.

In another embodiment, the plurality of light engines can produce red, green and blue light. Additionally, at least one individual light engine can produce red, green and blue light. Still further the control board can provide a plurality of apertures for receiving a light engine lens housing and the light engines can operate less than or equal to a die junction temperature of 125° C.

Also in accordance with the inventive aspects, a light fixture is provided. The light fixture can include a housing providing a heat sink, where the heat sink can provide a plurality of protrusions. A control board coupled to the heat sink can also be included, where the control board provide an aperture to receive a lens housing and an aperture to receive a coupling member to secure the control board to the heat sink. Still further, a plurality of light emitting diode light engines can be mounted to the control board where the individual heat sink protrusions of the plurality of heat sink protrusions can align with individual light engines of the plurality of light engines.

In another embodiment, the plurality of light engines can produce red, green and blue light. Additionally, at least one individual light engine can produce red, green and blue light. Also, the light engines can extend from the control board a uniform distance.

A method of manufacturing a light emitting diode housing is also provided in accordance with the inventive arrangements. The method can include the steps of providing a housing with a heat sink having a plurality of heat sink protrusions, providing a control board with a plurality of light engines and assembling the housing with the control board arranged such that the individual light engines of the plurality of light engines align with the individual heat sink protrusions of the plurality of heat sink protrusions. The method can also include the steps of securing the control board to the heat sink with a securing member, applying a thermal interface material between the light engine and the heat sink protrusion and wiring the control board to receive signals from a control console.

These and other aspects and features of the invention will become apparent upon review of the enclosed drawings and detailed description below.

BRIEF DESCRIPTION OF THE DRAWINGS

There are shown in the drawings embodiments which are presently preferred, it being understood, however, that the invention is not limited to the precise arrangements and instrumentalities shown.

DETAILED DESCRIPTION OF THE PREFERRED EMBODIMENTS

This invention is directed to a light emitting diode fixture with a housing 100 for light emitting diodes and provides a compact light fixture that efficiently dissipates heat created during operation. The housing 100 may have numerous configurations and applications, such as a spotlight or floodlight used for utility reasons or for lighting effects during entertainment.

Figure 1:
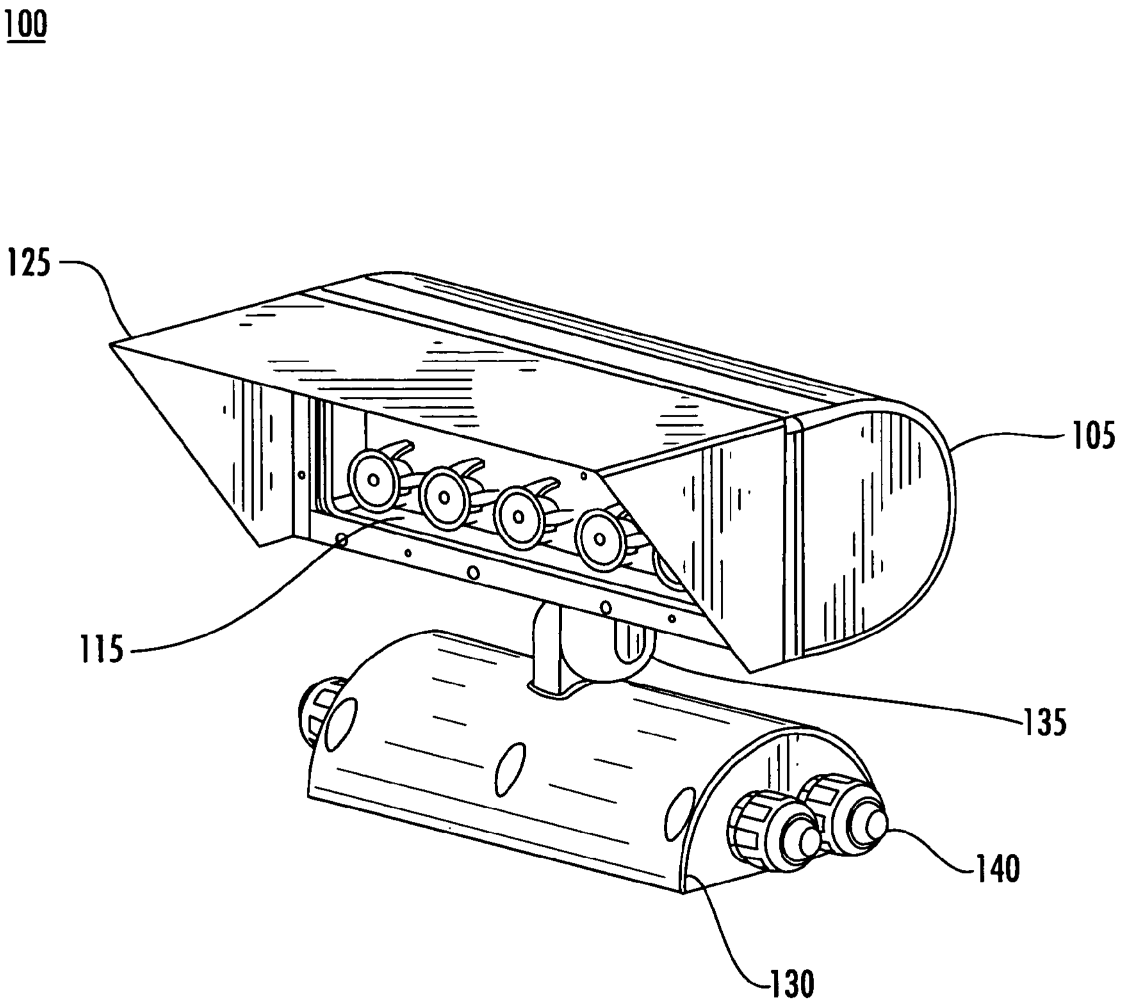
FIG. 1 is a perspective view of one embodiment of a light emitting diode fixture in accordance with the inventive arrangements.
Figure 2:
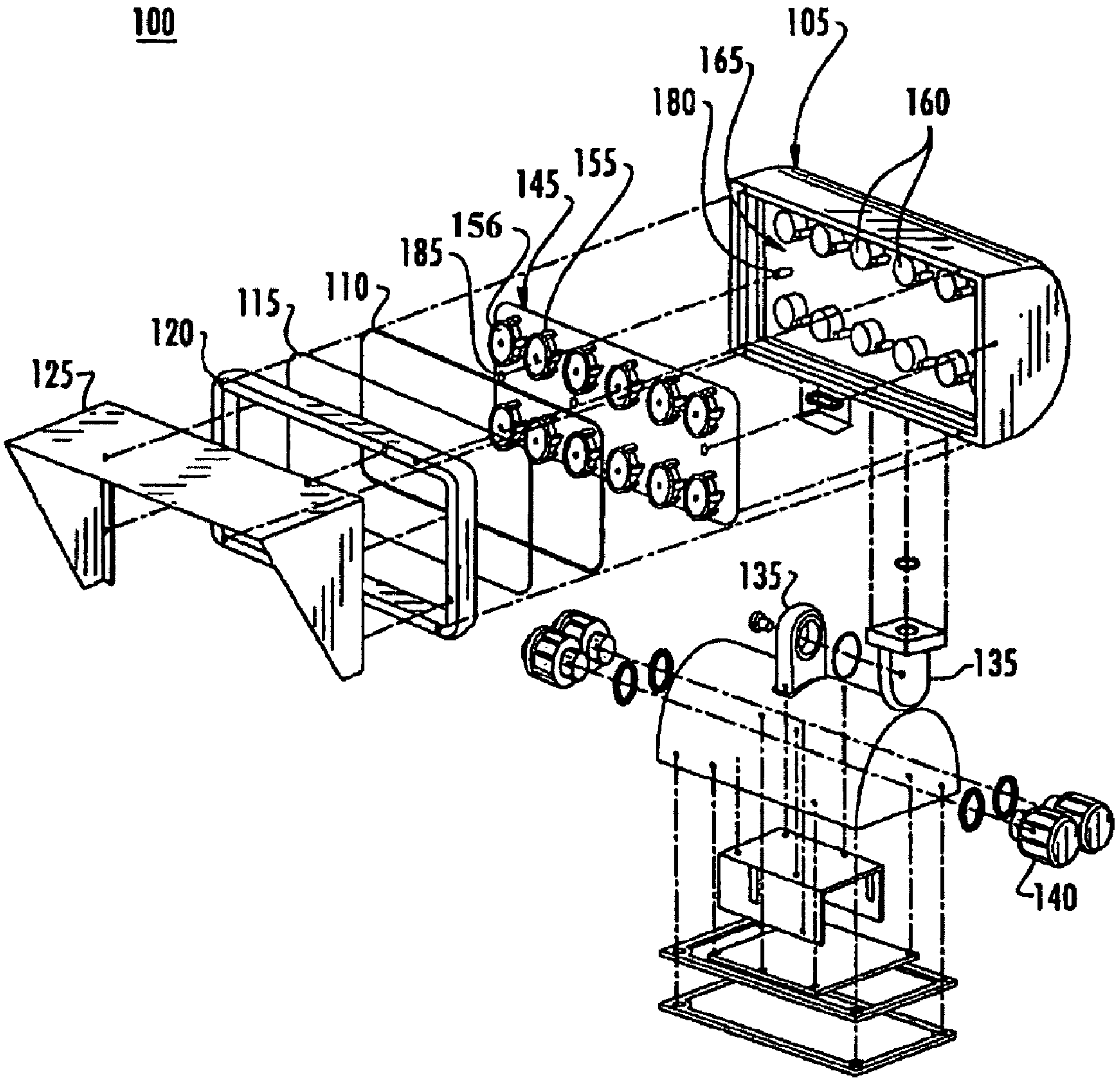
FIG. 2 is an exploded view of the embodiment of FIG. 1.

Referring to FIGS. 1 and 2, an embodiment of a housing 100 is shown. The housing 100 can include a body 105, an inner transparent plate 110, an outer transparent plate 115, a brace 120, a visor 125, a base 130, a movable connector 135 and conduit fittings 140, although it will be understood that the invention is not limited in this regard as the invention can include any or all of these components. The base 130 can be attached to a wall or other support structure and wiring for electricity and communications can be fed through conduit fittings 140 or scored knockout structures (not shown) on the base 130. The base 130 can be connected to the housing 105 with movable connector 135, which can pivot and/or rotate for adjustment of the direction of the light produced. Additionally, it should be noted that the housing 105 can be directly attached to a support structure, such as a wall.

Figure 3:
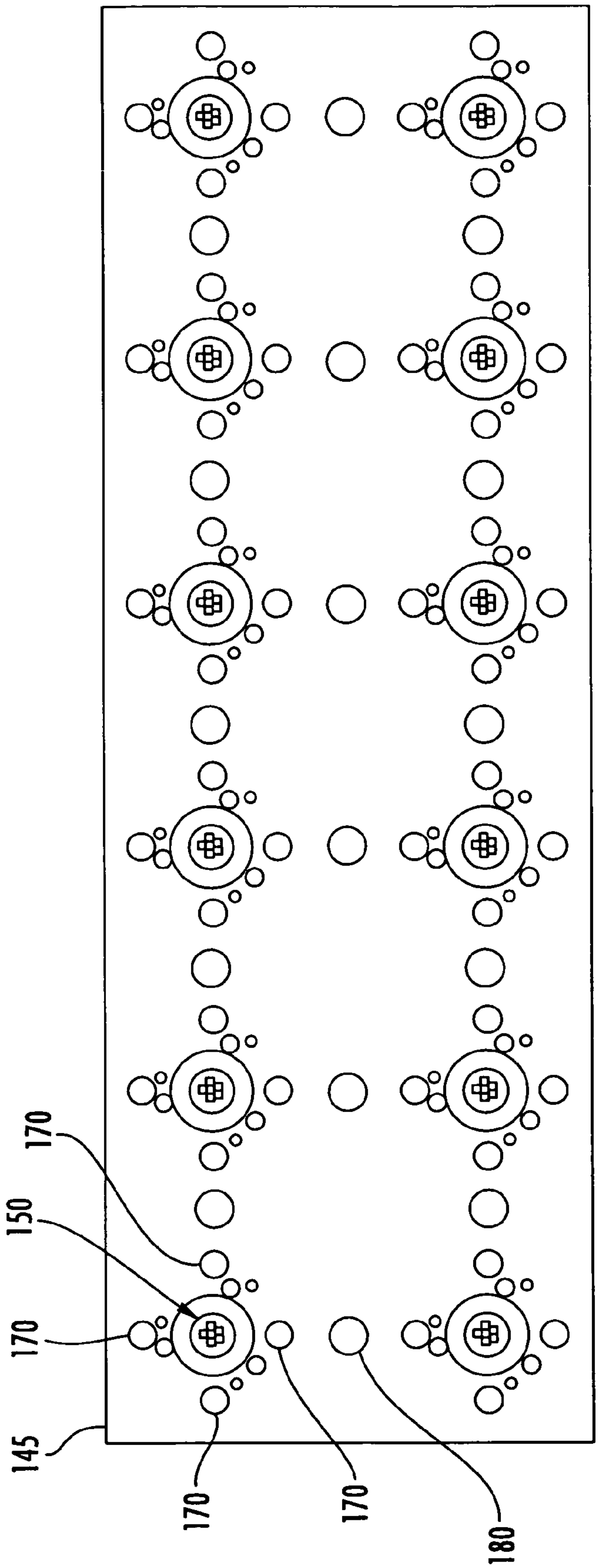
FIG. 3 is a top plan view of the control board of the embodiment of FIG. 1.

Referring to FIGS. 2 and 3, a control board 145 is also provided for mounting a plurality of light engines 150 and light, engine lens housings 155 holding lenses 156 over the light engines 150. As used herein, a light engine 150 is an any optical system that can collect light from a lamp, such as light emitting diode, and deliver the light to a target, which can be used by the target or can be reformatted, such as improving spatial, angular kind/or spectral uniformities of the light. Additionally, the light engines 150 can feature one or more LEDs, which can all be a single color or can be various colors. For instance, and individual light engine 150 can include one or more red LEDs, one or more green LEDs and one or more blue LEDs such that the light engine 150 can be produce red, green or blue light or any combination thereof. The light engine 150 can be any suitable light engine, such as the Lamina BL-4000 produced by Lamina Ceramics of Westampton, N.J.

The light engine lens housings 155 can be any suitable structure for holding lenses 156 over the light engines 150. The lenses 156 can be changed to provide various desired lighting effects. Further, the light engine lens housings 155 can snap fit into apertures 170 for easy installation and removal. Notably, the lenses 156 and the light engine housings 155 can be individually removed for each individual light engine 150 and can also be removed and inserted without removing the control board 145.

Figure 4A:
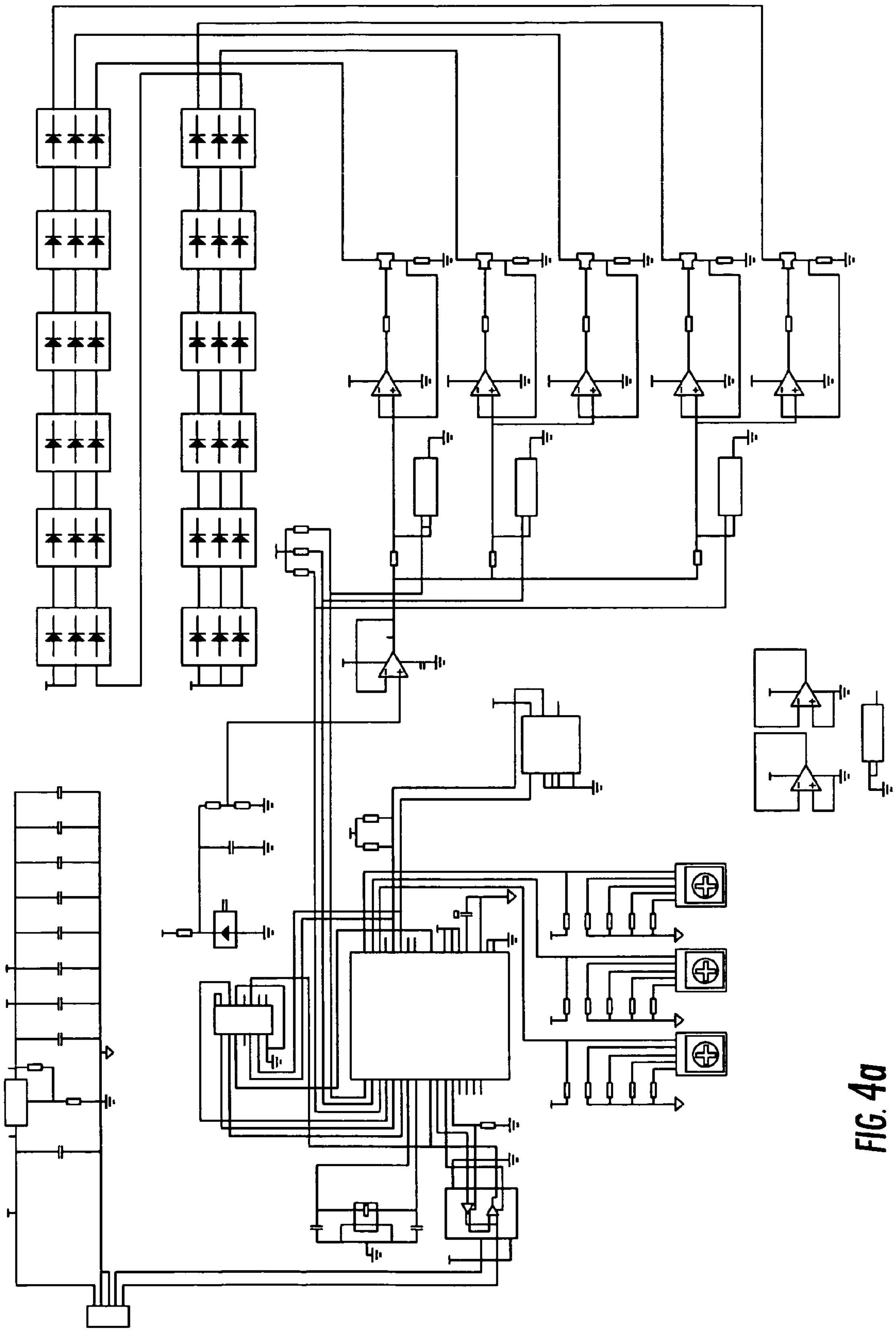
FIG. 4*a* a circuit diagram of one embodiment of the control board of FIG. 3.
Figure 4B:
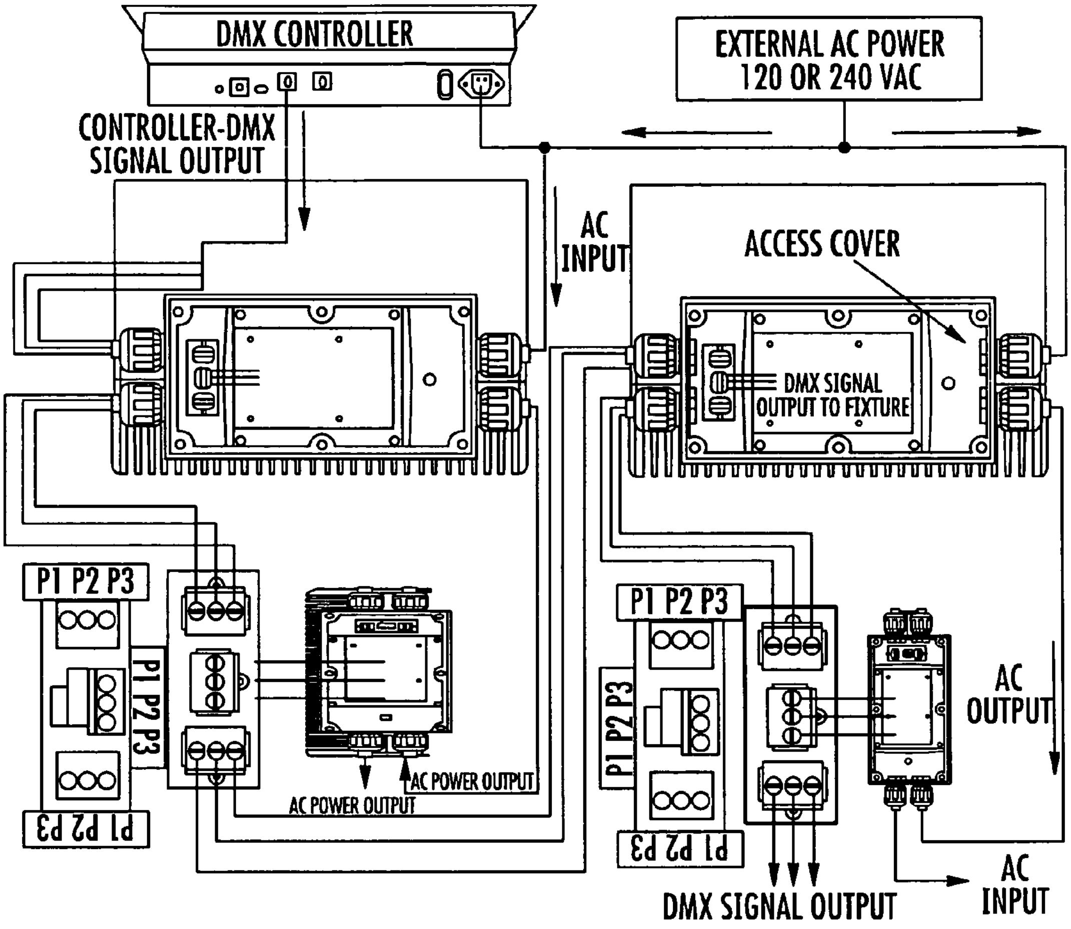
FIG. 4*b* is one embodiment of the wiring of the embodiment of FIG. 1.

The control board 145 can include suitable logic circuitry for providing electrical control over the individual light engines 150 mounted on control board 145. Additionally, the control board 145 can contain suitable etching and wiring for control of the light engines 150, such as the exemplary circuit diagram shown in FIG. 4*a*. As shown in FIGS. 4*a* and 4*b*, the control board 145 can be wired through the conduit fittings 140 and can be in communication with a control console (not shown) operating in compliance with the DMX512, DMX512/1990 or DMX512-A protocols, or any extensions thereof. These protocols can specify the transmission voltages, the data rate, the format of the data content, the type of cable and the type of connector to be used.

Figure 4C:
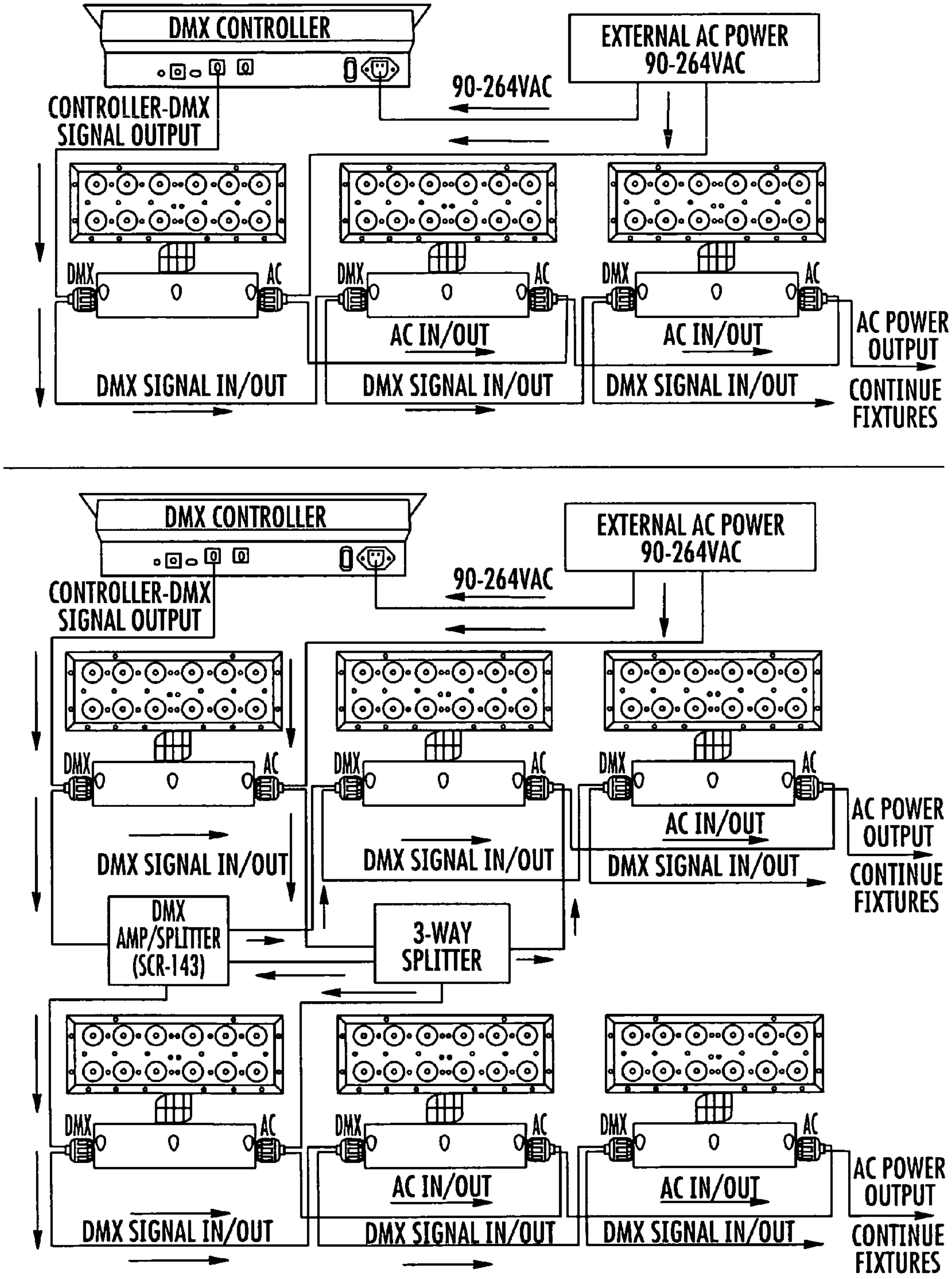
FIG. 4*c* is one embodiment of the wiring for multiple fixtures of FIG. 1.

With such a system, the level of light provided by the light engines 150 can be controllable from light levels from 0 to 100 percent into 256 steps. In operation, the control console can send levels to the light engines as a sequence of numbers, including a reset or break signal, a start code, and a sequence of numbers to control light properties, such the intensity. Additionally, multiple housings 100 can be wired to one control console in a daisy chain configuration, as shown in FIG. 4*c*.

Figure 5:
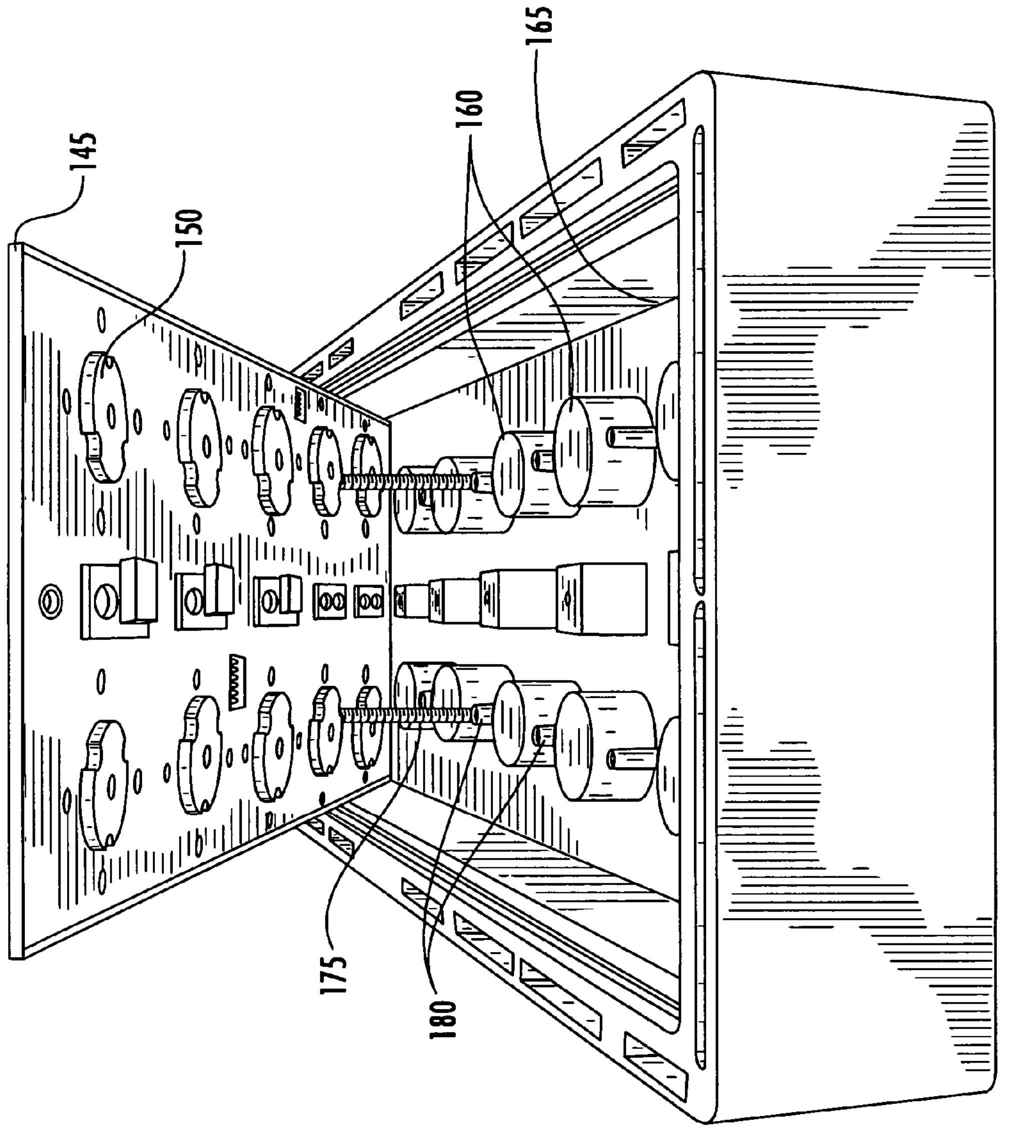
FIG. 5 is another perspective view of the embodiment of FIG. 1.

Referring to FIGS. 2, 3 and 5, the light engines 150 are spatially arranged on the control board 145 such that the light engines 150 align with protrusions 160 of heat sink 165. The light engines 150 are aligned for direct contact with heat sink protrusions 160 and to ensure that individual light engines 145 are centered on the individual heat sink protrusions 160. The heat sink 165 and the heat sink protrusions can be made of any suitable material, such as black anodized, aluminum extrusions or any other suitable materials.

Such an aligned direct contact arrangement ensures the junction temperature, $T_{junction}$) which is the temperature where the light is generated, does not exceed the limits of the light engine 150 or adversely affect the quality of the light produced by the light engine 150. The $T_{junction}$ is dependent upon the thermal resistance of the light engine 150, the heat sink protrusion 160 and any medium between the light engine 150 and the heat sink protrusion 160, as shown by the following equation, $T_{junction}=R\Theta_{total}\cdot\text{Power}+T_{ambient}+T_{guard\ band}$. The thermal resistance is calculated by dividing the difference in temperature between two points on a body by the energy that flows between two points per unit time and can be expressed by the following equation $$R\Theta = \frac{L}{K \cdot A},$$

where RΘ=Thermal Resistance; L=Thickness; A=Cross-sectional area; and K=Value of thermal conductivity. Thermal resistance can also be expressed by the following equation $$R\Theta = \frac{\Delta T}{Q},$$

where; ΔT=Change in temperature to area of interest; and Q=Heat flux.

Further, the $T_{junction}$ is dependent upon the thermal resistance values for each element in the thermal path, the overall thermal resistance can be expressed by the following equation, $R\Theta_{total}=\Sigma_{i+1}{}^{n}R\Theta_{i}$ or $R\Theta_{total}=R\Theta_{j-p}+R\Theta_{p-h}+R\Theta_{h-a}$, where $R\Theta_{j-p}$=Resistance of the Light Engine; $R\Theta_{p-h}$=Resistance of the Thermal Interface Material; and $R\Theta_{h-a}$=Resistance of the Heat Sink. Thus, the light engine 150 performance is dependent upon the thermal resistance of each element in the thermal path.

The combination of the control board 145 with the plurality of light engines 150 spatially arranged to align with the heat sink protrusions 160 ensures that thermal resistance is minimized in multiple manners. For instance, the light engines 150 are centered on the heat sink protrusions 160 to ensure maximum surface area contact, in contrast to an individually placed light engine and heat sink that may be misaligned. Additionally, the plurality of light engines 150 and the plurality of heat sink protrusions 160 can be arranged in arrays or some other arrangement as needed.

Further, mounting the light engines 150 to the control board 145 ensures that the light engines extend a uniform distance from the control board in the direction of the heat sink protrusions 160. Additionally, the heat sink protrusions 160 can extend from the heat sink 165 a uniform distances such that the control board 145 and light engines 150 lay flat on the heat sink protrusions 160. Such dimensions of the housing 100, the control board 145 and the heat sink protrusions provides direct contact between the light engines 150 and the heat sink protrusions 160. To further ensure the direct contact, a securing member 175, such as a screw, can be used to securely couple the control board 145 to the heat sink 165 through aperture 185 and to threaded receiving structures 180. Securing the control board 145 to the heat sink 165 provides another advantage that the light engines 150 will not be displaced from the heat sink protrusions 160 even if the housing 100 is accidentally dropped or receives a physical blow.

Additionally, thermal interface materials can be applied to the light engine 150 and/or the heat sink protrusion 160 to fill any gaps from irregularities in the interface between the light engine 150 and the heat sink protrusion 160. Thermal interface materials include greases, such as silicone based grease with ZnO, $Al_2O_3$, AlN, BN or other metal particles, gels, such as silicon or olefin materials including Al, $Al_2O_3$, Ag. Other suitable interface materials can also be used.

In operation, heat sink protrusions 160 dissipate heat produced by the light engines 150 to ensure that the junction temperature does not exceed 115° C. for optimal operating efficiency. Even when operating the light engines 150 to produce a maximum light intensity, the heat sink protrusions 160 ensure that the junction temperature does not exceed 125° C., which is the maximum temperature beyond which the light engine may fail.

It will be appreciated that, although terms such as upper, lower, front, and back have been included in this description, these are merely used to aid in the description of the features. Although the device 10 has a preferred orientation in use, it will function if installed in an orientation different from the illustrated embodiment. In such a case, parts described herein as being upper or lower will be reversed or altered, and the invention is not intended to be limited in this regard.

The foregoing is provided for purposes of illustrating, explaining, and describing embodiments of this invention. Modifications and adaptations to these embodiments will be apparent to those skilled in the art and may be made without departing from the scope or spirit of this invention. All publications and patents mentioned herein are incorporated by reference in their entirety, including all figures, graphs, equations, illustrations, and drawings to describe and disclose specific information for which the reference was cited.

What is claimed is:

1. A device for dissipating heat from light emitting diodes, comprising:

a heat sink with a plurality of protrusions;

a control board coupled to the heat sink; and a plurality of light emitting diode light engines mounted to the control board on a first side and extend through the control board to a second side; wherein the individual heat sink protrusions of the plurality of heat sink protrusions align with individual light engines of the plurality of light engines and the control board secures the light engines against the heat sink protrusions, and wherein each of the plurality of light engines are centered on and contacts an outermost surface of a respective aligned one of the plurality of heat sink protrusions proximate the second side of the control board.

2. The device of claim 1, wherein the control board couples to the heat sink with a securing member.

3. The device of claim 1, wherein the plurality of light engines produce red, green and blue light.

4. The device of claim 1, wherein at least one individual light engine produces red, green and blue light.

5. The device of claim 1, wherein the control board provides a plurality of apertures for receiving a light engine lens housing.

6. The device of claim 1, wherein the light engines are configured to operate less than or equal to a die junction temperature of 125° C.

7. The device of claim 1, wherein each of the light engines extend from the control board by an equal distance.

8. A light fixture, comprising:

a housing comprising a heat sink, the heat sink providing a plurality of protrusions;

a control board coupled to the heat sink, the control board providing an aperture to receive a lens housing and an aperture, to receive a coupling member to secure the control board to the sink; and a plurality of light emitting diode light engines mounted on the control board, wherein an outermost surface of the individual heat sink protrusions of the plurality of heat sink protrusions align, directly contacts and are centered with individual light engines of the plurality of light engines.

9. The light fixture of claim 8, wherein the plurality of light engines produce red, green and blue light.

10. The light fixture of claim 8, wherein at least one individual light engine produces green and blue light.

11. The light fixture of claim 8, wherein each of the light engines extend from the board by an equal distance.

12. A method of manufacturing a light emitting diode housing, comprising the steps of:

providing a housing comprising a heat sink having a plurality of heat sink protrusions;

providing a control board with a plurality of light engines thereon; and assembling the housing with the control board arranged such that the individual light engines of the plurality of light engines align and contacts an outermost surface of the individual heat sink protrusions of the plurality of heat sink protrusions.

13. The method of manufacturing of claim 12, further comprising the step of securing the control board to the heat sink with a securing member.

14. The method of manufacturing of claim 12, further comprising the step of applying a thermal interface material between the light engine and the heat sink protrusion.

15. The method of manufacturing of claim 12 further comprising the step of wiring the control board to receive signals from a control console.

16. The device of claim 1, wherein a distal end of each the individual heat sink protrusions abuts against a rear surface of a corresponding light engine.

17. The device of claim 16, wherein each of the light engines are centered with the distal end of a corresponding heat sink protrusion.

18. The device of claim 17, wherein a thermal interface material is positioned between each of the light engines and the corresponding heat sink protrusion.

19. The light fixture of claim 8, wherein a distal end of each of the individual heat sink protrusions abuts against a rear surface of a corresponding light engine, wherein each of the light engines are centered with the distal end of a corresponding heat sink protrusion, and wherein a thermal interface material is positioned between each of the light engines and the corresponding heat sink protrusion.

20. The method of manufacturing of claim 12, further comprising abutting a rear surface of each of the light engines with a distal end of a corresponding heat sink protrusion, and aligning the individual light engines with a center of the distal end of the corresponding heat sink protrusion.

21. The device of claim 1, wherein a center of a surface of each the plurality of light engines is aligned with a center of a surface of each respective aligned heat sink protrusion.

22. The device of claim 21, wherein the surface of each respective aligned heat sink protrusion forms a circular shape.

23. The device of claim 1, wherein the control board is configured with circuitry to provide signals to the plurality of light emitting diode light engines.

24. The device of claim 1, wherein the plurality of light emitting diode light engines and the plurality of protrusions are arranged in an array having a plurality of rows and a plurality of columns.

25. The device of claim 1, wherein alignments of the plurality of light emitting diode light engines with the plurality of protrusions dissipate heat so that a junction temperature does not exceed 115° C.

26. The device of claim 1, wherein the heat sink comprises a housing that houses at least the plurality of protrusions.

* * * * *